US010643706B1

(12) United States Patent
Moschiano et al.

(10) Patent No.: US 10,643,706 B1
(45) Date of Patent: May 5, 2020

(54) SEED OPERATION FOR MEMORY DEVICES

(71) Applicant: MICRON TECHNOLOGY, INC., Boise, ID (US)

(72) Inventors: Violante Moschiano, Avezzano (IT); Raffaele Bufano, Tremestieri Etneo (IT); Mirko Scapin, San Giorgio delle Pertiche (IT); Andrea Giovanni-Xotta, Cornedo Vicentino (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/224,901

(22) Filed: Dec. 19, 2018

(51) Int. Cl.
*G11C 16/10* (2006.01)
*G11C 16/24* (2006.01)
*G11C 8/12* (2006.01)
*G11C 16/04* (2006.01)
*G11C 11/408* (2006.01)
*G11C 16/34* (2006.01)

(52) U.S. Cl.
CPC .............. *G11C 16/10* (2013.01); *G11C 8/12* (2013.01); *G11C 11/4085* (2013.01); *G11C 16/0483* (2013.01); *G11C 16/24* (2013.01); *G11C 16/3427* (2013.01)

(58) Field of Classification Search
CPC ............ G11C 16/10; G11C 8/12; G11C 16/24
USPC ............. 365/185.18, 185.11, 185.25, 185.26
See application file for complete search history.

(56) References Cited

U.S. PATENT DOCUMENTS

2006/0181926 A1* 8/2006 Ema .................. G11C 16/0416
365/185.18
2010/0110795 A1 5/2010 Tamada et al.
2015/0348637 A1* 12/2015 Han ....................... G11C 16/16
365/185.2
2017/0084337 A1* 3/2017 Joo ......................... G11C 16/10

* cited by examiner

*Primary Examiner* — Han Yang
(74) *Attorney, Agent, or Firm* — Dicke, Billig & Czaja, PLLC

(57) ABSTRACT

A memory device includes a plurality of data lines, a common source, and control logic. The control logic is configured to implement a seed operation by biasing each of the plurality of data lines to a first voltage level with the common source biased to a second voltage level lower than the first voltage level. With each data line biased to the first voltage level, the control logic is configured to float each data line and bias the common source to the first voltage level such that the bias of each data line is boosted above the first voltage level due to capacitive coupling between each data line and the common source.

20 Claims, 8 Drawing Sheets

| $270_0$ | $270_1$ | $270_2$ | $270_3$ |
|---|---|---|---|
| Block$_0$ $250_0$ | Block$_0$ $250_0$ | Block$_0$ $250_0$ | Block$_0$ $250_0$ |
| Block$_1$ $250_1$ | Block$_1$ $250_1$ | Block$_1$ $250_1$ | Block$_1$ $250_1$ |
| Block$_2$ $250_2$ | Block$_2$ $250_2$ | Block$_2$ $250_2$ | Block$_2$ $250_2$ |
| Block$_3$ $250_3$ | Block$_3$ $250_3$ | Block$_3$ $250_3$ | Block$_3$ $250_3$ |
| Block$_4$ $250_4$ | Block$_4$ $250_4$ | Block$_4$ $250_4$ | Block$_4$ $250_4$ |
| ⋮ | ⋮ | ⋮ | ⋮ |
| Block$_{L-4}$ $250_{L-4}$ | Block$_{L-4}$ $250_{L-4}$ | Block$_{L-4}$ $250_{L-4}$ | Block$_{L-4}$ $250_{L-4}$ |
| Block$_{L-3}$ $250_{L-3}$ | Block$_{L-3}$ $250_{L-3}$ | Block$_{L-3}$ $250_{L-3}$ | Block$_{L-3}$ $250_{L-3}$ |
| Block$_{L-2}$ $250_{L-2}$ | Block$_{L-2}$ $250_{L-2}$ | Block$_{L-2}$ $250_{L-2}$ | Block$_{L-2}$ $250_{L-2}$ |
| Block$_{L-1}$ $250_{L-1}$ | Block$_{L-1}$ $250_{L-1}$ | Block$_{L-1}$ $250_{L-1}$ | Block$_{L-1}$ $250_{L-1}$ |
| Block$_L$ $250_L$ | Block$_L$ $250_L$ | Block$_L$ $250_L$ | Block$_L$ $250_L$ |
| $240_0$ | $240_1$ | $240_2$ | $240_3$ |

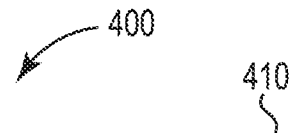

DURING THE SEED OPERATION, BIASING A DRAIN SELECT LINE OF A SELECTED BLOCK OF MEMORY CELLS TO A PREDETERMINED VOLTAGE LEVEL

Fig. 5C

DURING THE SEED OPERATION, BIASING A DRAIN SELECT LINE OF A SELECTED BLOCK OF MEMORY CELLS TO THE SECOND VOLTAGE LEVEL TO GENERATE GATE-INDUCED DRAIN LEAKAGE (GIDL) IN THE SELECTED BLOCK OF MEMORY CELLS

Fig. 5D

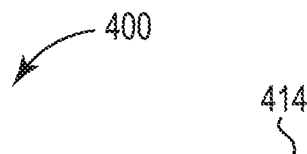

WITH THE DATA LINES BOOSTED ABOVE THE FIRST VOLTAGE LEVEL, INHIBITING WRITING TO MEMORY CELLS OF A SELECTED BLOCK OF MEMORY CELLS

Fig. 5E

SEED OPERATION FOR MEMORY DEVICES

TECHNICAL FIELD

The present disclosure relates generally to memory and, in particular, in one or more embodiments, the present disclosure relates to apparatus and methods for seed operations in memory devices.

BACKGROUND

Memory devices are typically provided as internal, semiconductor, integrated circuit devices in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Changes in threshold voltage of the memory cells, through programming (which is often referred to as writing) of charge storage structures (e.g., floating gates or charge traps) or other physical phenomena (e.g., phase change or polarization), determine the data value of each cell. Common uses for flash memory include personal computers, tablet computers, digital cameras, digital media players, cellular telephones, solid state drives and removable memory modules, and the uses are growing.

Inhibit operations may be used in flash memory devices to prevent the programming of certain memory cells during a write operation. Seed operations may be used in flash memory devices to improve boost voltages for inhibit operations. As supply voltages (e.g., VCC) used to power flash memory devices are reduced, the efficiency of seed operations may also be reduced.

For the reasons stated above, and for other reasons stated below which will become apparent to those skilled in the art upon reading and understanding the present specification, there is a need in the art for alternative methods for implementing seed operations, and system and apparatus to perform such methods.

BRIEF DESCRIPTION OF THE DRAWINGS

FIGS. 2A-2D are schematic diagrams of portions of an array of memory cells as could be used in a memory device of the type described with reference to FIG. 1.

FIGS. 5A-5E are flow diagrams illustrating one embodiment of a method for implementing a seed operation in a memory device.

DETAILED DESCRIPTION

Figure 1:
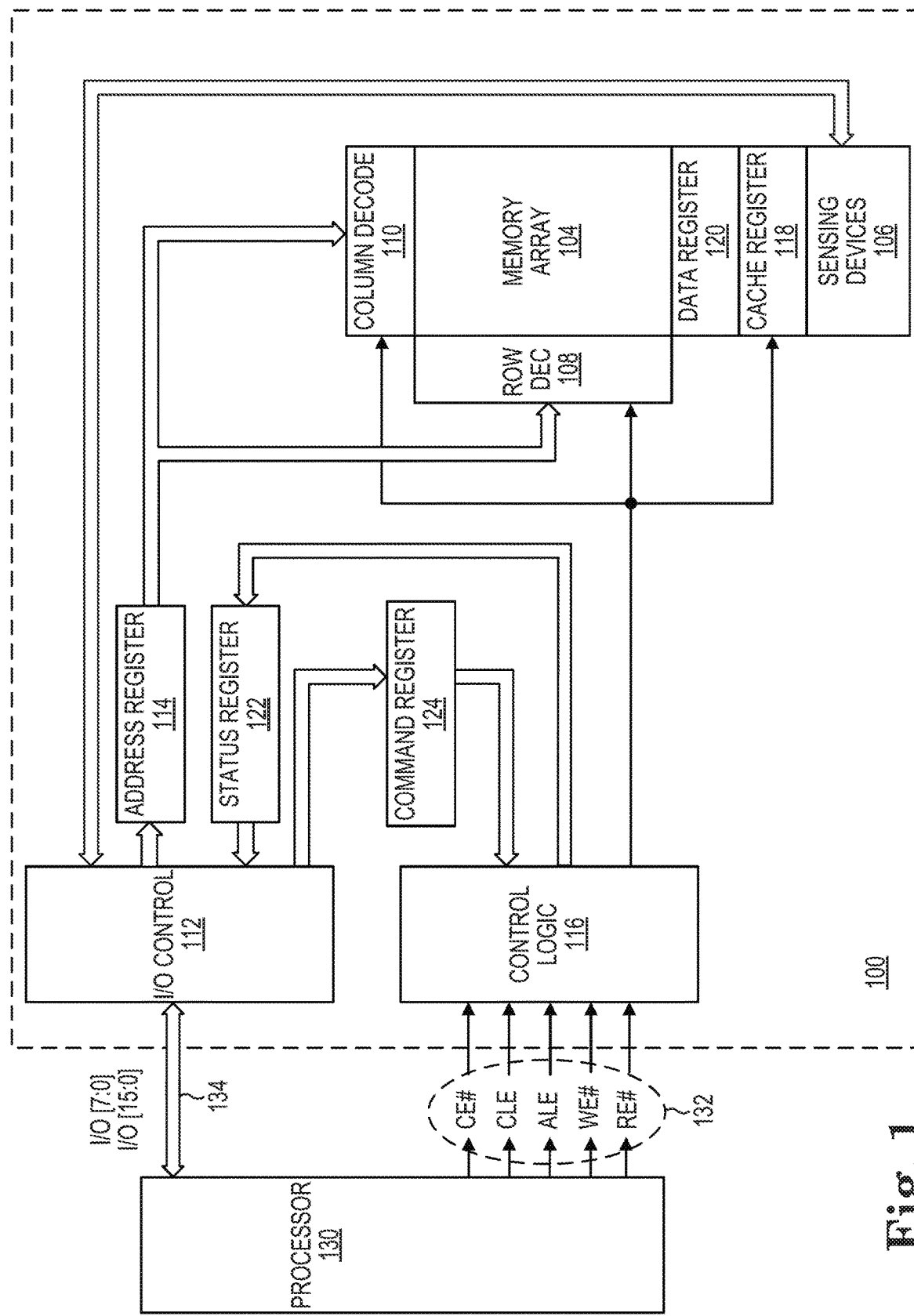
FIG. 1 is a simplified block diagram of one embodiment of a memory device in communication with a processor as part of an electronic system.

In the following detailed description, reference is made to the accompanying drawings that form a part hereof, and in which is shown, by way of illustration, specific embodiments. In the drawings, like reference numerals describe substantially similar components throughout the several views. Other embodiments may be utilized and structural, logical and electrical changes may be made without departing from the scope of the present disclosure. The following detailed description is, therefore, not to be taken in a limiting sense.

Seed operations may be used to improve boost voltages for inhibit operations. In a three-dimensional (3D) NAND memory device, seed operations may also be used to initialize the channel voltage with the bit line voltage (e.g., ~VCC) or to cleanup any negative pillar bias accumulated from previous operations. In one example, gate-induced drain leakage (GIDL) may be generated during seed operations to eliminate negative pillar bias. As supply voltages (e.g., VCC) are reduced, the efficiency of seed operations may also be reduced. Accordingly, disclosed herein are methods and apparatus to perform seed operations in memory devices by taking advantage of the capacitive coupling between the common source and the bit lines of the memory devices.

FIG. 1 is a simplified block diagram of a first apparatus, in the form of a memory device 100, in communication with a second apparatus, in the form of a processor 130, as part of a third apparatus, in the form of an electronic system, according to an embodiment. Some examples of electronic systems include personal computers, tablet computers, digital cameras, digital media players, digital recorders, games, appliances, vehicles, wireless devices, cellular telephones and the like. The processor 130, e.g., a controller external to the memory device 100, may be a memory controller or other external host device.

Memory device 100 includes an array of memory cells 104 logically arranged in rows and columns. Memory cells of a logical row are typically coupled to the same access line (commonly referred to as a word line) while memory cells of a logical column are typically selectively coupled to the same data line (commonly referred to as a bit line). A single access line may be associated with more than one logical row of memory cells and a single data line may be associated with more than one logical column. Memory cells (not shown in FIG. 1) of at least a portion of array of memory cells 104 are capable of being programmed to one of at least two data states.

A row decode circuitry 108 and a column decode circuitry 110 are provided to decode address signals. Address signals are received and decoded to access the array of memory cells 104. Memory device 100 also includes I/O control circuitry 112 to manage input of commands, addresses and data to the memory device 100 as well as output of data and status information from the memory device 100. An address register 114 is in communication with I/O control circuitry 112 and row decode circuitry 108 and column decode circuitry 110 to latch the address signals prior to decoding. A command register 124 is in communication with I/O control circuitry 112 and control logic 116 to latch incoming commands.

An internal controller (e.g., control logic 116) controls access to the array of memory cells 104 in response to the commands and generates status information for the external processor 130, i.e., control logic 116 is configured to perform access operations in accordance with embodiments described herein. The control logic 116 is in communication with row decode circuitry 108 and column decode circuitry 110 to control the row decode circuitry 108 and column decode circuitry 110 in response to the addresses.

Control logic 116 is also in communication with a cache register 118. Cache register 118 latches data, either incoming or outgoing, as directed by control logic 116 to temporarily store data while the array of memory cells 104 is busy writing or reading, respectively, other data. During a program operation (e.g., write operation), data is passed from sensing devices 106 to the cache register 118. The data is then passed from the cache register 118 to data register 120 for transfer to the array of memory cells 104; then new data is latched in the cache register 118 from sensing devices 106, which receive the new data from the I/O control circuitry 112. During a read operation, data is passed from the cache register 118 to sensing devices 106, which pass the data to the I/O control circuitry 112 for output to the external processor 130; then new data is passed from the data register 120 to the cache register 118. A status register 122 is in communication with I/O control circuitry 112 and control logic 116 to latch the status information for output to the processor 130.

Memory device 100 receives control signals at control logic 116 from processor 130 over a control link 132. The control signals may include at least a chip enable CE #, a command latch enable CLE, an address latch enable ALE, a write enable WE #, and a read enable RE #. Additional control signals (not shown) may be further received over control link 132 depending upon the nature of the memory device 100. Memory device 100 receives command signals (which represent commands), address signals (which represent addresses), and data signals (which represent data) from processor 130 over a multiplexed input/output (I/O) bus 134 and outputs data to processor 130 over I/O bus 134.

For example, the commands are received over input/output (I/O) pins [7:0] of I/O bus 134 at I/O control circuitry 112 and are written into command register 124. The addresses are received over input/output (I/O) pins [7:0] of bus 134 at I/O control circuitry 112 and are written into address register 114. The data are received over input/output (I/O) pins [7:0] for an 8-bit device or input/output (I/O) pins [15:0] for a 16-bit device at I/O control circuitry 112 and are written into cache register 118 through sensing devices 106. The data are subsequently written into data register 120 for programming the array of memory cells 104. For another embodiment, cache register 118 may be omitted, and the data are written directly into data register 120 through sensing devices 106. Data are also output over input/output (I/O) pins [7:0] for an 8-bit device or input/output (I/O) pins [15:0] for a 16-bit device.

It will be appreciated by those skilled in the art that additional circuitry and signals can be provided, and that the memory device of FIG. 1 has been simplified. It should be recognized that the functionality of the various block components described with reference to FIG. 1 may not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Additionally, while specific I/O pins are described in accordance with popular conventions for receipt and output of the various signals, it is noted that other combinations or numbers of I/O pins may be used in the various embodiments.

Figure 2A:
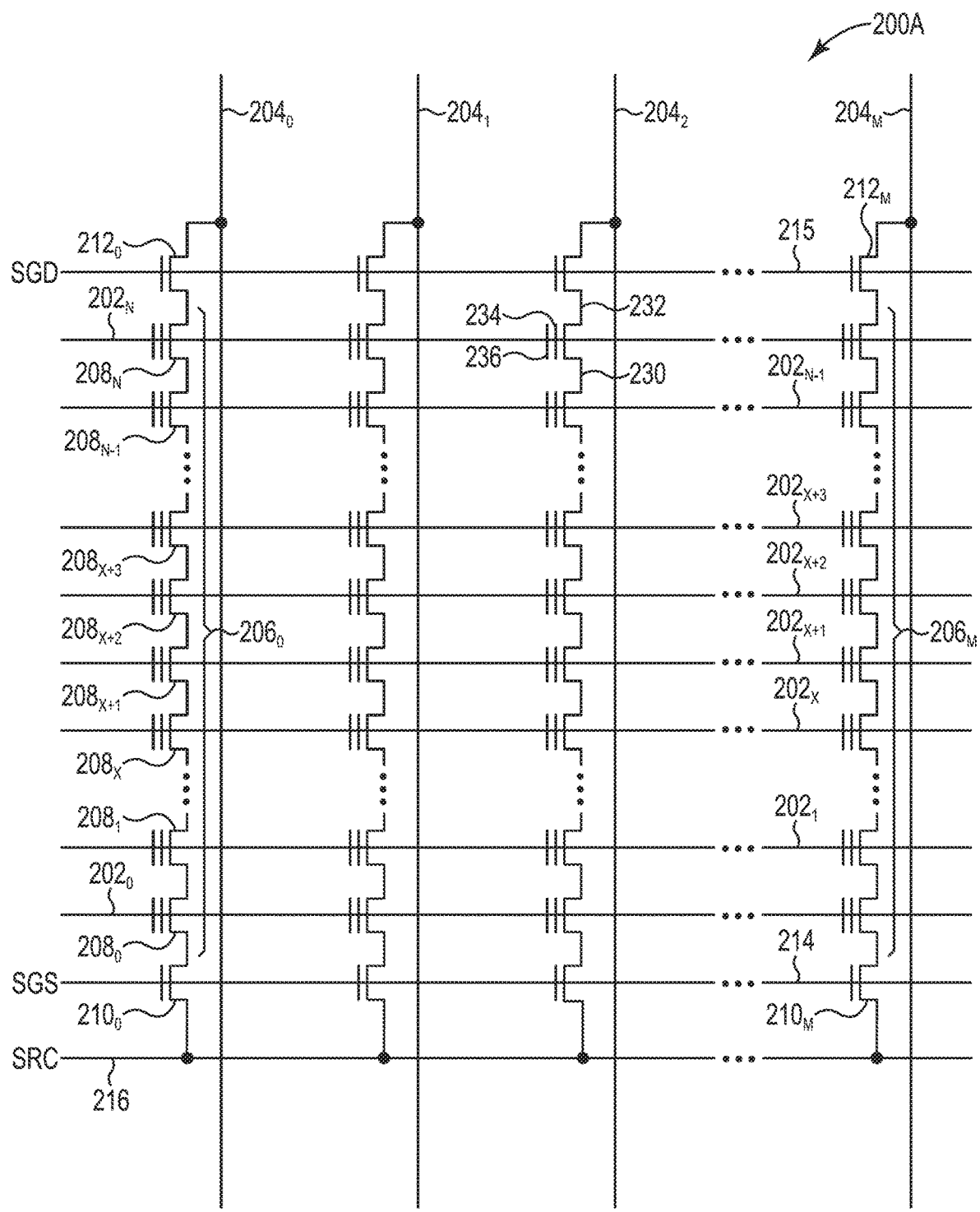

FIG. 2A is a schematic of a NAND memory array 200A, e.g., as a portion of array of memory cells 104. Memory array 200A includes access lines, such as word lines $202_0$ to $202_N$, and data lines, such as bit lines $204_0$ to $204_M$. The word lines 202 may be coupled to global access lines (e.g., global word lines), not shown in FIG. 2A, in a many-to-one relationship. For some embodiments, memory array 200A may be formed over a semiconductor that, for example, may be conductively doped to have a conductivity type, such as a p-type conductivity, e.g., to form a p-well, or an n-type conductivity, e.g., to form an n-well.

Memory array 200A might be arranged in rows (each corresponding to a word line 202) and columns (each corresponding to a bit line 204). Each column may include a string of series-coupled memory cells, such as one of NAND strings $206_0$ to $206_M$. Each NAND string 206 might be coupled to a common source 216 and might include memory cells $208_0$ to $208_N$. The memory cells 208 represent non-volatile memory cells for storage of data. The memory cells 208 of each NAND string 206 might be connected in series between a select transistor 210 (e.g., a field-effect transistor), such as one of the select transistors $210_0$ to $210_M$ (e.g., that may be source select transistors, commonly referred to as select gate source), and a select transistor 212 (e.g., a field-effect transistor), such as one of the select transistors $212_0$ to $212_M$ (e.g., that may be drain select transistors, commonly referred to as select gate drain). Select transistors $210_0$ to $210_M$ might be commonly coupled to a select line 214, such as a source select line, and select transistors $212_0$ to $212_M$ might be commonly coupled to a select line 215, such as a drain select line.

A source of each select transistor 210 might be connected to common source 216. The drain of each select transistor 210 might be connected to the source of a memory cell $208_0$ of the corresponding NAND string 206. For example, the drain of select transistor $210_0$ might be connected to the source of memory cell $208_0$ of the corresponding NAND string $206_0$. Therefore, each select transistor 210 might be configured to selectively couple a corresponding NAND string 206 to common source 216. A control gate of each select transistor 210 might be connected to select line 214.

The drain of each select transistor 212 might be connected to the bit line 204 for the corresponding NAND string 206. For example, the drain of select transistor $212_0$ might be connected to the bit line $204_0$ for the corresponding NAND string $206_0$. The source of each select transistor 212 might be connected to the drain of a memory cell $208_N$ of the corresponding NAND string 206. For example, the source of select transistor $212_0$ might be connected to the drain of memory cell $208_N$ of the corresponding NAND string $206_0$. Therefore, each select transistor 212 might be configured to selectively couple a corresponding NAND string 206 to a corresponding bit line 204. A control gate of each select transistor 212 might be connected to select line 215.

The memory array in FIG. 2A might be a quasi-two-dimensional memory array and might have a generally planar structure, e.g., where the common source 216, strings 206 and bit lines 204 extend in substantially parallel planes. Alternatively, the memory array in FIG. 2A might be a three-dimensional memory array, e.g., where strings 206 may extend substantially perpendicular to a plane containing the common source 216 and to a plane containing the bit lines 204 that may be substantially parallel to the plane containing the common source 216.

Typical construction of memory cells 208 includes a data-storage structure 234 (e.g., a floating gate, charge trap, etc.) that can determine a data value of the cell (e.g., through changes in threshold voltage), and a control gate 236, as shown in FIG. 2A. Memory cells 208 may further have a defined source 230 and a defined drain 232. Memory cells 208 have their control gates 236 coupled to (and in some cases form) a word line 202.

A column of the memory cells 208 is a NAND string 206 or a plurality of NAND strings 206 coupled to a given bit line 204. A row of the memory cells 208 are memory cells 208 commonly coupled to a given word line 202. A row of memory cells 208 can, but need not include all memory cells 208 commonly coupled to a given word line 202. Rows of memory cells 208 may often be divided into one or more groups of physical pages of memory cells 208, and physical pages of memory cells 208 often include every other memory cell 208 commonly coupled to a given word line 202. For example, memory cells 208 commonly coupled to word line $202_N$ and selectively coupled to even bit lines 204 (e.g., bit lines $204_0$, $204_2$, $204_4$, etc.) may be one physical page of memory cells 208 (e.g., even memory cells) while memory cells 208 commonly coupled to word line $202_N$ and selectively coupled to odd bit lines 204 (e.g., bit lines $204_1$, $204_3$, $204_5$, etc.) may be another physical page of memory cells 208 (e.g., odd memory cells). Although bit lines $204_3$ $204_5$ are not expressly depicted in FIG. 2A, it is apparent from the figure that the bit lines 204 of the array of memory cells 200A may be numbered consecutively from bit line $204_0$ to bit line $204_M$. Other groupings of memory cells 208 commonly coupled to a given word line 202 may also define a physical page of memory cells 208. For certain memory devices, all memory cells commonly coupled to a given word line might be deemed a physical page. The portion of a physical page (which, in some embodiments, could still be the entire row) that is read during a single read operation or programmed during a program operation (e.g., an upper or lower page memory cells) might be deemed a logical page.

Figure 2B:
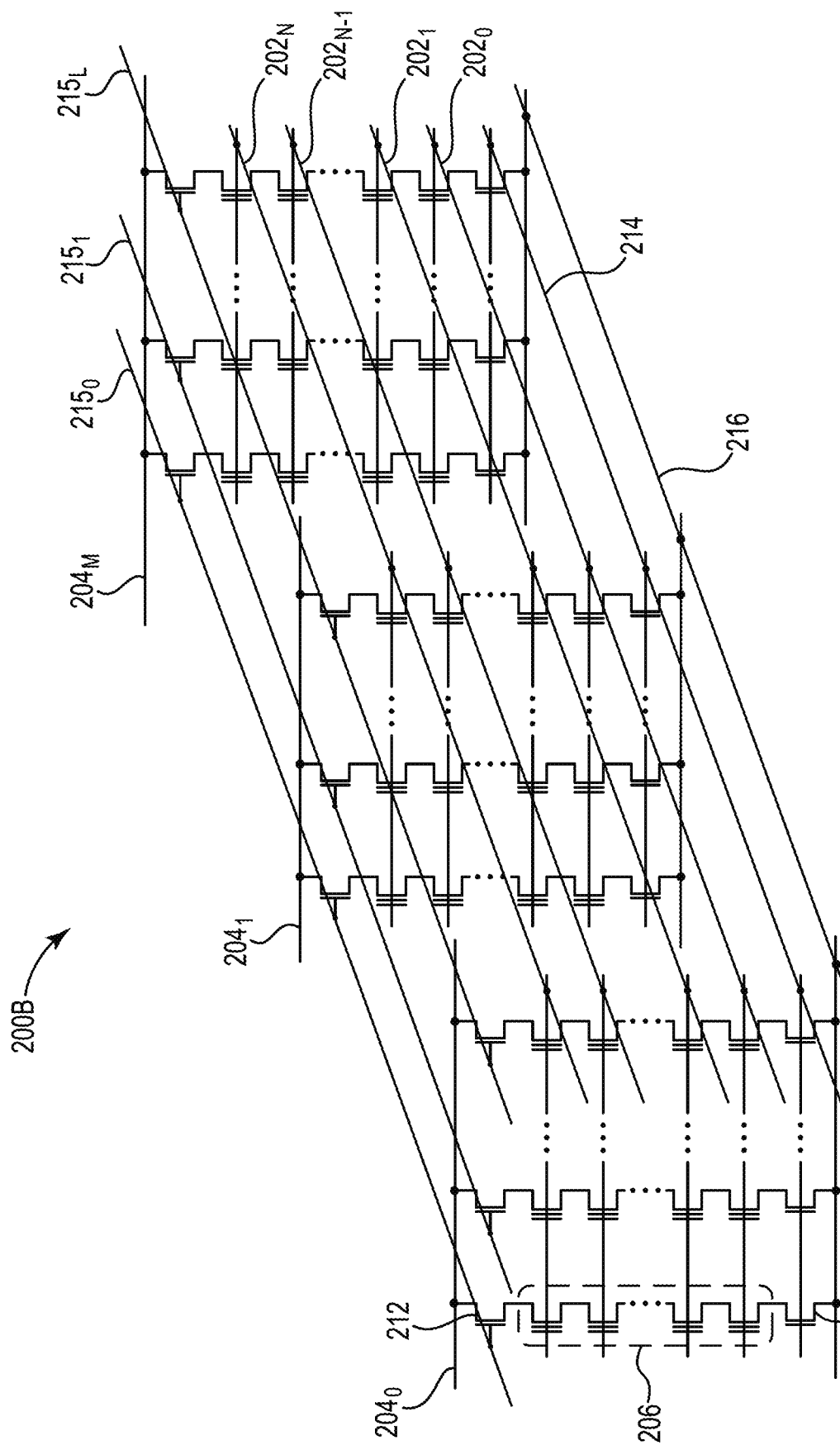

FIG. 2B is another schematic of a portion of an array of memory cells 200B as could be used in a memory of the type described with reference to FIG. 1, e.g., as a portion of array of memory cells 104. Like numbered elements in FIG. 2B correspond to the description as provided with respect to FIG. 2A. FIG. 2B provides additional detail of one example of a three-dimensional NAND memory array structure. The three-dimensional NAND memory array 200B may incorporate vertical structures which may include semiconductor pillars where a portion of a pillar may act as a channel region of the memory cells of NAND strings 206. The NAND strings 206 may be each selectively connected to a bit line $204_0$ to $204_M$ by a select transistor 212 (e.g., that may be drain select transistors, commonly referred to as select gate drain) and to a common source 216 by a select transistor 210 (e.g., that may be source select transistors, commonly referred to as select gate source). Multiple NAND strings 206 might be selectively connected to the same bit line 204. Subsets of NAND strings 206 can be connected to their respective bit lines 204 by biasing the select lines $215_0$ to $215_L$ to selectively activate particular select transistors 212 each between a NAND string 206 and a bit line 204. The select transistors 210 can be activated by biasing the select line 214. Each word line 202 may be connected to multiple rows of memory cells of the memory array 200B. Rows of memory cells that are commonly connected to each other by a particular word line 202 may collectively be referred to as tiers.

Figure 2C:
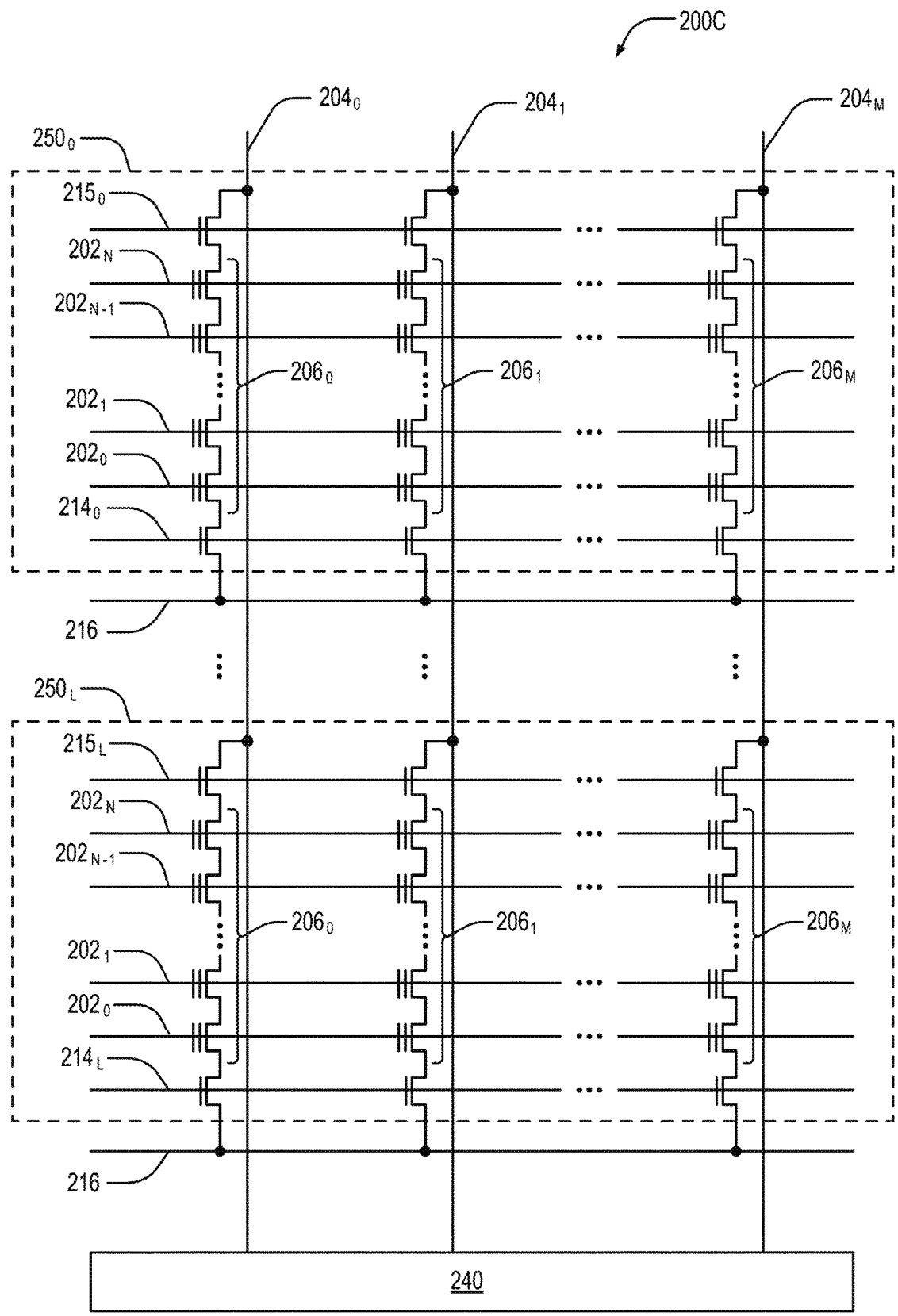

FIG. 2C is a further schematic of a portion of an array of memory cells 200C as could be used in a memory of the type described with reference to FIG. 1, e.g., as a portion of array of memory cells 104. Like numbered elements in FIG. 2C correspond to the description as provided with respect to FIG. 2A. Array of memory cells 200C may include strings of series-connected memory cells (e.g., NAND strings) 206, access (e.g., word) lines 202, data (e.g., bit) lines 204, select lines 214 (e.g., source select lines), select lines 215 (e.g., drain select lines) and source 216 as depicted in FIG. 2A. A portion of the array of memory cells 200A may be a portion of the array of memory cells 200C, for example. FIG. 2C depicts groupings of NAND strings 206 into blocks of memory cells 250. Blocks of memory cells 250 may be groupings of memory cells 208 that may be erased together in a single erase operation, sometimes referred to as erase blocks. Each block of memory cells 250 might represent those NAND strings 206 commonly associated with a single select line 215, e.g., select line $215_0$. The source 216 for the block of memory cells $250_0$ might be a same source as the source 216 for the block of memory cells $250_L$. For example, each block of memory cells $250_0$-$250_L$ might be commonly selectively connected to the source 216. Access lines 202 and select lines 214 and 215 of one block of memory cells 250 may have no direct connection to access lines 202 and select lines 214 and 215, respectively, of any other block of memory cells 250.

The data lines $204_0$ to $204_M$ may be connected (e.g., selectively connected) to a buffer portion 240, which might be a portion of a page buffer of the memory. The buffer portion 240 might correspond to a memory plane (e.g., the set of blocks of memory cells $250_0$ to $250_L$). The buffer portion 240 might include sensing devices (not shown) for sensing data values indicated on respective data lines 204, and corresponding registers (not shown) for storage of the sensed data values from its corresponding memory plane.

FIG. 2D is a block schematic of a portion of an array of memory cells as could be used in a memory of the type described with reference to FIG. 1. The array of memory cells 260 is depicted to have four memory planes 270 (e.g., memory planes $270_0$ to $270_3$), each in communication with a respective buffer portion 240, which might collectively form a page buffer 272. While four memory planes 270 are depicted, other numbers of memory planes 270 might be commonly in communication with a page buffer 272. Each memory plane 270 is depicted to include L+1 blocks of memory cells 250 (e.g., blocks of memory cells $250_0$ to $250_L$).

Although the examples of FIGS. 2A-2D are discussed in conjunction with NAND flash, the embodiments described herein are not limited to a particular array architecture or structure, and can include other structures (e.g., cross-point memory, DRAM, etc.) and other architectures (e.g., AND arrays, NOR arrays, etc.).

Figure 3:
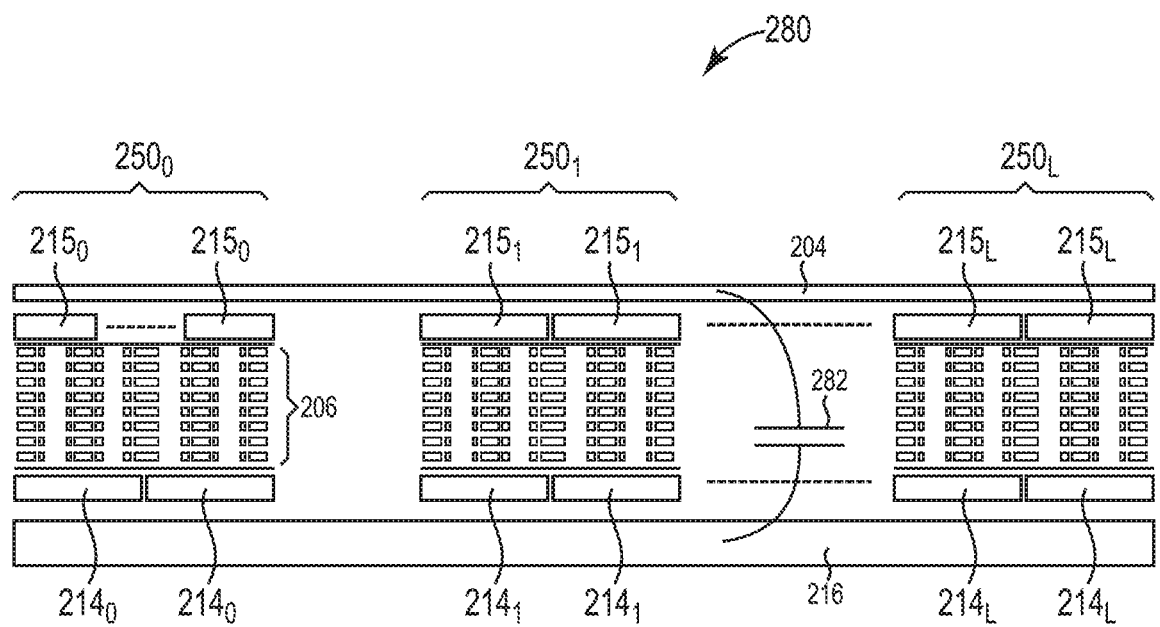
FIG. 3 is a side view of a portion of a memory device as could be used in the memory device of the type described with reference to FIG. 1.

FIG. 3 is a side view of a portion of a memory device 280 as could be used in the memory device of the type described with reference to FIG. 1. Memory device 280 includes blocks of memory cells $250_0$ to $250_L$. Each block of memory cells 250 may be three dimensional such as depicted in FIG. 2B. One of the blocks of memory cells 250 (e.g., block of memory cells $250_0$) may be selected for access while the remaining blocks of memory cells (e.g., blocks of memory cells $250_1$ to $250_L$) may be deselected. Referring back to FIGS. 2B and 2C in combination with FIG. 3, memory device 280 also includes a plurality of bit lines 204 (only one bit line is visible in FIG. 3), a plurality of drain select lines $215_0$ to $215_L$, a plurality of NAND strings 206 arranged in pillars, a plurality of source select lines $214_0$ to $214_L$, and a common source 216. Each block of memory cells $250_0$ to $250_L$ is coupled to the plurality of bit lines 204 (e.g., via select transistors 212) and the common source 216 (e.g., via select transistors 210). Each block of memory cells $250_0$ to $250_L$ is also coupled to a corresponding drain select line $215_0$ to $215_L$ and a corresponding source select line $214_0$ to $214_L$.

As illustrated in FIG. 3, the bit lines 204 may be arranged in an upper plane of memory device 280. Drain select lines $215_0$ to $215_L$ may be arranged in a plane of memory device 280 below the bit lines 204. Each NAND string 206 may be arranged in a pillar below the drain select lines $215_0$ to $215_L$. Source select lines $214_0$ to $214_L$ may be arranged in a plane of memory device 280 below the NAND strings 206. Common source 216 may be arranged in a plane of memory device 280 below source select lines $214_0$ to $214_L$. Due to the arrangement of bit lines 204 and common source 216, there is capacitive coupling between the bit lines 204 and the common source 216 as indicated at 282.

Control logic, such as control logic 116 previously described and illustrated with reference to FIG. 1, is configured to implement a seed operation. The seed operation is implemented by biasing each of the plurality of bit lines 204 to a first voltage level (e.g., VCC) with the common source 216 biased to a second voltage level (e.g., 0V) lower than the first voltage level. With each bit line 204 biased to the first voltage level, the control logic floats each bit line 204 and biases the common source 216 to the first voltage level such that the bias of each bit line 204 is boosted above the first voltage level due to the capacitive coupling 282 between each bit line 204 and the common source 216.

Figure 4:
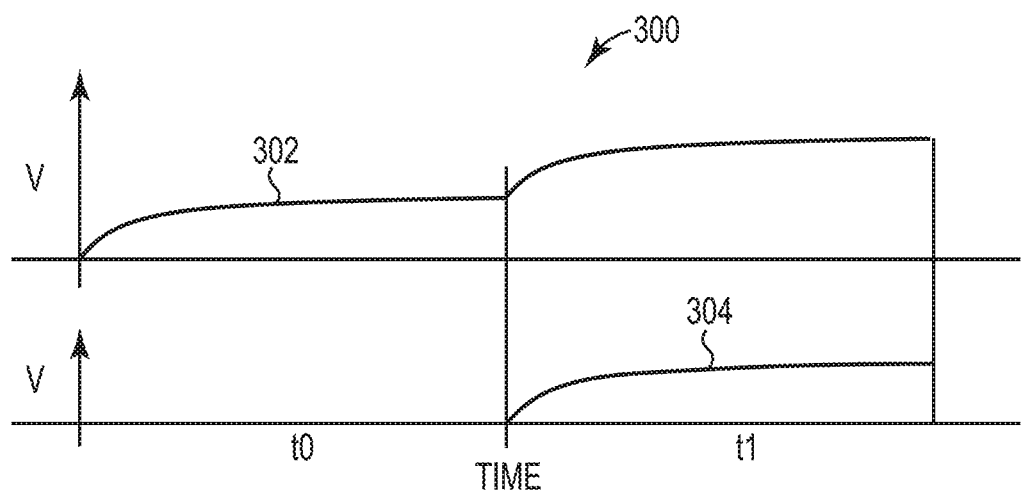
FIG. 4 is a chart depicting one example of a seed operation.

This seed operation is depicted by chart 300 of FIG. 4. Chart 300 illustrates the bit line voltage 302 and the common source voltage 304 versus time. During period t0, the bit lines are biased to the first voltage level (e.g., VCC) while the common source is biased to the second voltage level (e.g., 0V). With the bit line voltage 302 at the first voltage level, during period t1 the bit lines are floated and the common source is biased to the first voltage level (e.g., VCC). Due to capacitive coupling between the bit lines and the common source, the bit line voltage 302 is boosted above the first voltage level to a second voltage level (e.g., ~VCC+ VCC×CR, where CR is the capacitance ratio).

Referring back to FIG. 3, in one example, with each bit line 204 floating, the control logic is configured to further implement the seed operation by biasing the drain select line 215 of each deselected block of memory cells to the first voltage level such that the bias of each bit line 204 is boosted above the first voltage level due to capacitive coupling between each bit line 204 and the drain select line 215 of each deselected block of memory cells. During the seed operation, the control logic may be configured to bias the drain select line 215 of a selected block of memory cells 250 to a predetermined voltage level (e.g., 5.6V). The predetermined voltage level may be set to activate the select transistors 212 of the selected block of memory cells. In another example, during the seed operation, the control logic may be configured to bias the drain select line 215 of a selected block of memory cells 250 to the second voltage level (e.g., 0V) to generate gate-induced drain leakage (GIDL) in the selected block of memory cells. With the seed operation complete, the control logic may implement an inhibit operation with the bias of each bit line 204 boosted above the first voltage level.

Figure 5A:
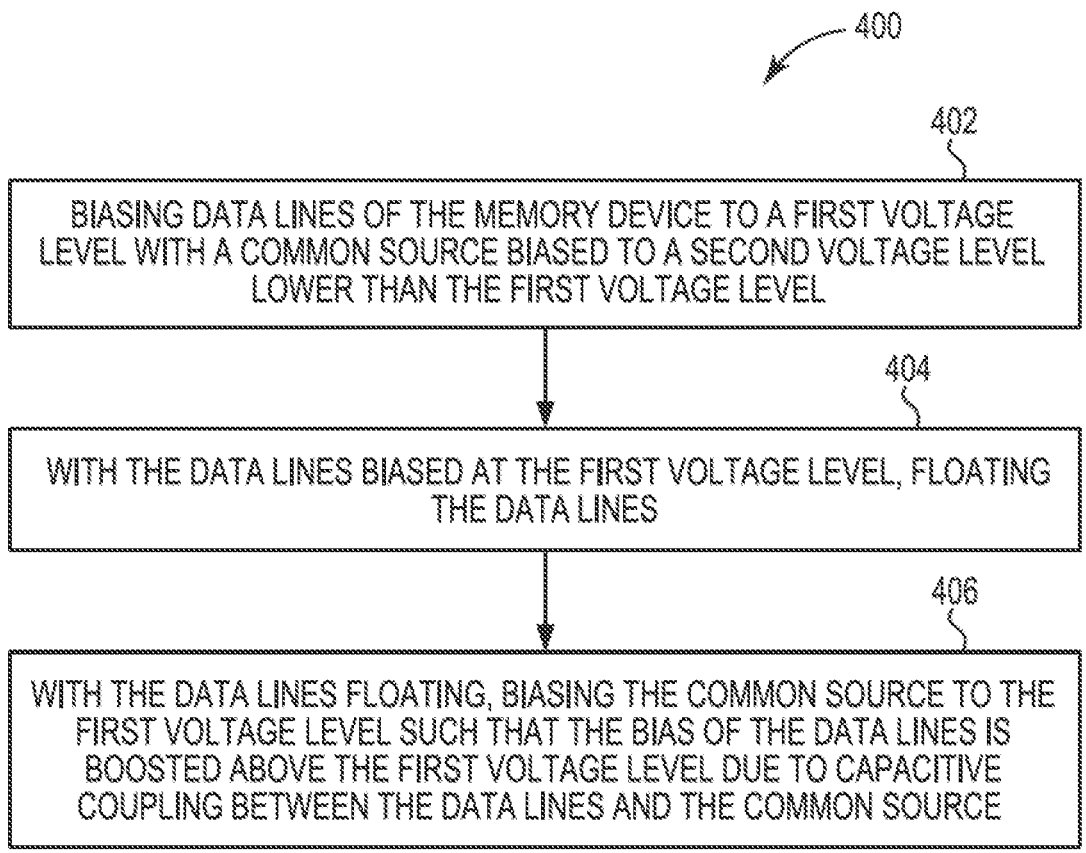

FIGS. 5A-5E are flow diagrams illustrating one embodiment of a method 400 for implementing a seed operation in a memory device. In one example, method 400 may be implemented by memory device 280 of FIG. 3. As illustrated in FIG. 5A, at 402 method 400 includes biasing data lines, e.g., bit lines, of the memory device to a first voltage level with a common source biased to a second voltage level lower than the first voltage level. In one example, the memory device may include a three-dimensional NAND memory device. At 404, method 402 includes with the data lines biased at the first voltage level, floating the data lines. At 406, method 402 includes with the data lines floating, biasing the common source to the first voltage level such that the bias of the data lines is boosted above the first voltage level due to capacitive coupling between the data lines and the common source.

Figure 5B:
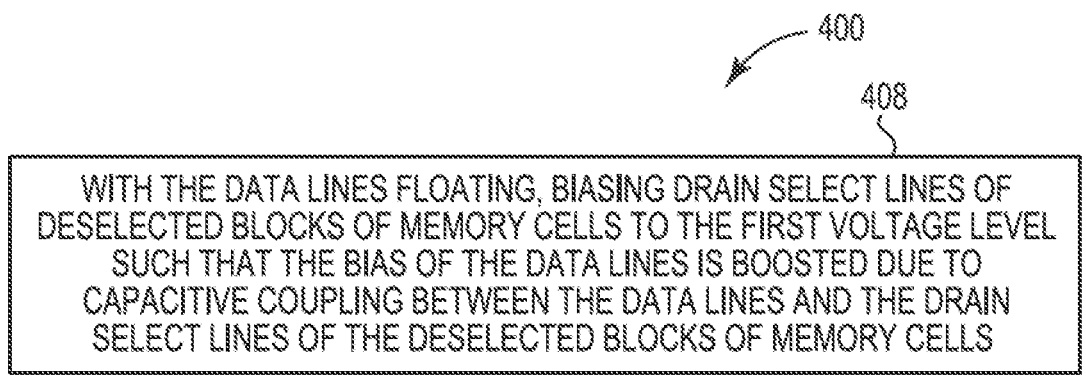

As illustrated in FIG. 5B, at 408 method 400 may further include with the data lines floating, biasing drain select lines of deselected blocks of memory cells to the first voltage level such that the bias of the data lines is boosted due to capacitive coupling between the data lines and the drain select lines of the deselected blocks of memory cells. As illustrated in FIG. 5C, at 410 method 400 may further include during the seed operation, biasing a drain select line of a selected block of memory cells to a predetermined voltage level (e.g., to activate the select gates). As illustrated in FIG. 5D, at 412 method 400 may further include during the seed operation, biasing a drain select line of a selected block of memory cells to the second voltage level to generate gate-induced drain leakage (GIDL) in the selected block of memory cells. As illustrated in FIG. 5E, at 414 method 400 may further include with the data lines boosted above the first voltage level, inhibiting writing to memory cells of a selected block of memory cells.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. Accordingly, this application is intended to cover any adaptations or variations of the embodiments.

What is claimed is:

1. A memory device comprising:
a plurality of data lines;
a common source; and
control logic configured to implement a seed operation by biasing each of the plurality of data lines to a first voltage level with the common source biased to a second voltage level lower than the first voltage level, and with each data line biased to the first voltage level, floating each data line and biasing the common source to the first voltage level such that the bias of each data line is boosted above the first voltage level due to capacitive coupling between each data line and the common source.

2. The memory device of claim 1, further comprising:
a plurality of drain select lines; and
a plurality of blocks of memory cells, each block of memory cells coupled to the plurality of data lines and the common source, and each block of memory cells coupled to a drain select line,
wherein with each data line floating, the control logic is configured to bias the drain select line of each deselected block of memory cells to the first voltage level such that the bias of each data line is boosted above the first voltage level due to capacitive coupling between each data line and the drain select line of each deselected block of memory cells.

3. The memory device of claim 1, further comprising:
a plurality of drain select lines; and a plurality of blocks of memory cells, each block of memory cells coupled to the plurality of data lines and the common source, and each block of memory cells coupled to a drain select line,
wherein during the seed operation, the control logic is configured to bias the drain select line of a selected block of memory cells to a predetermined voltage level.

4. The memory device of claim 1, further comprising:
a plurality of drain select lines; and
a plurality of blocks of memory cells, each block of memory cells coupled to the plurality of data lines and the common source, and each block of memory cells coupled to a drain select line,
wherein during the seed operation, the control logic is configured to bias the drain select line of a selected block of memory cells to the second voltage level to generate gate-induced drain leakage (GIDL) in the selected block of memory cells.

5. The memory device of claim 1, wherein the control logic implements an inhibit operation with the bias of each data line boosted above the first voltage level.

6. The memory device of claim 1, wherein the plurality of data lines comprises even data lines and odd data lines.

7. The memory device of claim 1, wherein the memory device comprises a three-dimensional NAND memory device.

8. A memory device comprising:
a plurality of blocks of memory cells;
a plurality of data lines coupled to each block of memory cells;
a common source coupled to each block of memory cells; and
control logic configured to implement a seed operation by biasing each of the plurality of data lines to a first voltage level with the common source biased to a second voltage level lower than the first voltage level, and with each data line biased to the first voltage level, floating each data line and biasing the common source to the first voltage level such that the bias of each data line is boosted above the first voltage level due to capacitive coupling between each data line and the common source.

9. The memory device of claim 8, further comprising:
a plurality of drain select lines, each drain select line coupled to a block of memory cells,
wherein with each data line floating, the control logic is configured to bias the drain select line of each deselected block of memory cells to the first voltage level such that the bias of each data line is boosted above the first voltage level due to capacitive coupling between each data line and the drain select line of each deselected block of memory cells.

10. The memory device of claim 8, further comprising:
a plurality of drain select lines, each drain select line coupled to a block of memory cells,
wherein during the seed operation, the control logic is configured to bias the drain select line of a selected block of memory cells to a predetermined voltage level.

11. The memory device of claim 8, further comprising:
a plurality of drain select lines, each drain select line coupled to a block of memory cells,
wherein during the seed operation, the control logic is configured to bias the drain select line of a selected block of memory cells to the second voltage level to generate gate-induced drain leakage (GIDL) in the selected block of memory cells.

12. The memory device of claim 8, wherein the control logic implements an inhibit operation with the bias of each data line boosted above the first voltage level.

13. The memory device of claim 8, wherein the plurality of data lines comprises even data lines and odd data lines.

14. The memory device of claim 8, wherein the memory device comprises a three-dimensional NAND memory device.

15. A method for implementing a seed operation in a memory device, the method comprising:
biasing data lines of the memory device to a first voltage level with a common source biased to a second voltage level lower than the first voltage level;
with the data lines biased at the first voltage level, floating the data lines; and
with the data lines floating, biasing the common source to the first voltage level such that the bias of the data lines is boosted above the first voltage level due to capacitive coupling between the data lines and the common source.

16. The method of claim 15, further comprising:
with the data lines floating, biasing drain select lines of deselected blocks of memory cells to the first voltage level such that the bias of the data lines is boosted due to capacitive coupling between the data lines and the drain select lines of the deselected blocks of memory cells.

17. The method of claim 15, further comprising:
during the seed operation, biasing a drain select line of a selected block of memory cells to a predetermined voltage level.

18. The method of claim 15, further comprising:
during the seed operation, biasing a drain select line of a selected block of memory cells to the second voltage level to generate gate-induced drain leakage (GIDL) in the selected block of memory cells.

19. The method of claim 15, further comprising:
with the data lines boosted above the first voltage level, inhibiting writing to memory cells of a selected block of memory cells.

20. The method of claim 15, wherein the memory device comprises a three-dimensional NAND memory device.

* * * * *